(12) United States Patent
Kriman et al.

(10) Patent No.: US 11,374,381 B1
(45) Date of Patent: Jun. 28, 2022

(54) INTEGRATED LASER MODULE

(71) Applicant: Apple Inc., Cupertino, CA (US)

(72) Inventors: Moshe Kriman, Tel Aviv (IL); Ido Luft, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 341 days.

(21) Appl. No.: 16/795,634

(22) Filed: Feb. 20, 2020

Related U.S. Application Data

(60) Provisional application No. 62/859,212, filed on Jun. 10, 2019.

(51) Int. Cl.
| | |
|---|---|
| *H01S 5/026* | (2006.01) |
| *H01L 33/54* | (2010.01) |
| *H01L 33/56* | (2010.01) |
| *H01L 21/768* | (2006.01) |
| *H01S 5/183* | (2006.01) |

(52) U.S. Cl.
CPC ...... *H01S 5/0261* (2013.01); *H01L 21/76877* (2013.01); *H01L 33/54* (2013.01); *H01L 33/56* (2013.01); *H01S 5/183* (2013.01)

(58) Field of Classification Search
CPC .................................................. H01S 5/0261
USPC ..................................................... 372/50.124
See application file for complete search history.

(56) References Cited

U.S. PATENT DOCUMENTS

| | | | |
|---|---|---|---|
| 5,500,540 A | | 3/1996 | Jewell et al. |
| 5,867,513 A | * | 2/1999 | Sato ............... H01S 5/0687 372/38.07 |
| 6,014,400 A | | 1/2000 | Kobayashi |
| 6,057,560 A | | 5/2000 | Uchida |
| 6,201,825 B1 | | 3/2001 | Sakuria et al. |
| 6,317,446 B1 | | 11/2001 | Wipiejewski |
| 6,327,287 B1 | * | 12/2001 | Kner ............... H01S 5/0687 372/20 |

(Continued)

FOREIGN PATENT DOCUMENTS

| | | |
|---|---|---|
| CN | 1585217 A | 2/2005 |
| CN | 1632958 A | 6/2005 |

(Continued)

OTHER PUBLICATIONS

JP Application # 2020159986 Office Action dated Nov. 8, 2021.

(Continued)

*Primary Examiner* — Tuan N Nguyen
(74) *Attorney, Agent, or Firm* — Kligler & Associates Patent Attorneys Ltd

(57) ABSTRACT

An optoelectronic device includes a driver die including drive circuits and first bond pads on a front surface of the driver die. An emitter die is mounted on the front surface of the driver die and includes one or more vertical emitters and second bond pads connected to the vertical emitters. An encapsulation layer contains the emitter die and has an inner surface adjacent to the front surface of the driver die. Conductive vias extend through the encapsulation layer and have inner ends connected to the first bond pads and outer ends at an outer surface of the encapsulation layer. A redistribution layer is disposed over the outer surface of the encapsulation layer and includes conductive traces, each of which is connected to at least one terminal selected from a group of terminals consisting of the second bond pads and the outer ends of the conductive vias.

20 Claims, 12 Drawing Sheets

(56) References Cited

U.S. PATENT DOCUMENTS

| | | |
|---|---|---|
| 6,455,340 B1 | 9/2002 | Chua et al. |
| 6,519,271 B2 | 2/2003 | Kwon et al. |
| 6,549,556 B1 | 4/2003 | Hwang et al. |
| 6,583,445 B1 | 6/2003 | Reedy et al. |
| 6,589,805 B2 | 7/2003 | Zhu et al. |
| 6,798,806 B1 | 9/2004 | Johnson et al. |
| 6,917,640 B2 | 7/2005 | Kwak |
| 7,215,692 B2 | 5/2007 | Jewell |
| 7,415,055 B2 | 8/2008 | Deng et al. |
| 8,520,114 B2 | 8/2013 | Cok et al. |
| 8,654,811 B2 | 2/2014 | Geske et al. |
| 9,036,956 B2 | 5/2015 | Tseng et al. |
| 9,038,883 B2 | 5/2015 | Wang et al. |
| 9,157,790 B2 | 10/2015 | Shpunt et al. |
| 9,389,069 B2 | 7/2016 | Bloom et al. |
| 9,692,211 B2 | 6/2017 | Matsubara et al. |
| 9,740,032 B2 | 8/2017 | Park et al. |
| 9,742,153 B1 | 8/2017 | Barve et al. |
| 9,825,425 B2 | 11/2017 | Mor |
| 9,865,994 B2 | 1/2018 | Matsubara et al. |
| 10,082,633 B2 | 9/2018 | Schaevitz et al. |
| 10,134,945 B1 | 11/2018 | Liu et al. |
| 10,325,894 B1 | 6/2019 | Pan |
| 2002/0042187 A1 | 4/2002 | Trezza et al. |
| 2002/0075922 A1 | 6/2002 | Yoo et al. |
| 2002/0150130 A1 | 10/2002 | Coldren et al. |
| 2003/0169795 A1 | 9/2003 | Otoma et al. |
| 2003/0194168 A1 | 10/2003 | Ouchi |
| 2004/0099857 A1 | 5/2004 | Song et al. |
| 2004/0120376 A1 | 6/2004 | Kwak |
| 2004/0241892 A1 | 12/2004 | Colgan et al. |
| 2005/0169343 A1 | 8/2005 | Ostermann et al. |
| 2005/0189551 A1 | 9/2005 | Peng et al. |
| 2006/0002444 A1 | 1/2006 | Wang et al. |
| 2006/0013276 A1 | 1/2006 | McHugo |
| 2006/0033114 A1 | 2/2006 | Schranz |
| 2006/0227836 A1 | 10/2006 | Omori et al. |
| 2007/0041411 A1 | 2/2007 | Pallec et al. |
| 2007/0091961 A1 | 4/2007 | Lin et al. |
| 2007/0120206 A1 | 5/2007 | Song et al. |
| 2009/0032908 A1 | 2/2009 | Masui et al. |
| 2009/0161713 A1 | 6/2009 | Duggan et al. |
| 2010/0029027 A1 | 2/2010 | Ikuta et al. |
| 2010/0203660 A1 | 8/2010 | Tanaka |
| 2010/0208764 A1 | 8/2010 | Otoma et al. |
| 2011/0182314 A1 | 7/2011 | Yoshikawa et al. |
| 2011/0187878 A1 | 8/2011 | Mor et al. |
| 2013/0038881 A1 | 2/2013 | Pesach et al. |
| 2013/0075761 A1 | 3/2013 | Akiyama |
| 2013/0156060 A1 | 6/2013 | Futagawa et al. |
| 2013/0216247 A1 | 8/2013 | Oba et al. |
| 2013/0285115 A1 | 10/2013 | Wei et al. |
| 2013/0286614 A1 | 10/2013 | Tan et al. |
| 2014/0007935 A1 | 1/2014 | Multitu et al. |
| 2014/0211215 A1 | 7/2014 | Pesach et al. |
| 2015/0255955 A1 | 9/2015 | Wang et al. |
| 2015/0333047 A1 | 11/2015 | Pfeuffer |
| 2015/0340841 A1 | 11/2015 | Joseph |
| 2016/0377414 A1 | 12/2016 | Thuries et al. |
| 2017/0005455 A1 | 1/2017 | Padullaparth |
| 2017/0256914 A1 | 9/2017 | Hsu et al. |
| 2017/0353012 A1 | 12/2017 | Barve et al. |
| 2018/0019302 A1 | 1/2018 | Deppe |
| 2018/0122785 A1 | 5/2018 | Fiorentino et al. |
| 2018/0241177 A1 | 8/2018 | Wong et al. |
| 2018/0287345 A1 | 10/2018 | Laflaquiere et al. |
| 2019/0036308 A1 | 1/2019 | Carson et al. |
| 2019/0164946 A1 | 5/2019 | Fu et al. |
| 2019/0250257 A1 | 8/2019 | Finkelstein et al. |
| 2019/0305522 A1 | 10/2019 | Yuen et al. |
| 2019/0346641 A1* | 11/2019 | Schlepple ............ G02B 6/4272 |
| 2019/0348819 A1 | 11/2019 | Laflaquiere et al. |
| 2019/0363520 A1 | 11/2019 | Laflaquiere et al. |
| 2020/0106245 A1 | 4/2020 | Barve et al. |

FOREIGN PATENT DOCUMENTS

| | | |
|---|---|---|
| CN | 101026211 A | 8/2007 |
| CN | 101447647 A | 6/2009 |
| CN | 101841129 A | 9/2010 |
| CN | 102354712 A1 | 2/2012 |
| CN | 103050063 A | 4/2013 |
| CN | 109378709 A | 2/2019 |
| CN | 110338815 A | 10/2019 |
| CN | 110739604 A | 1/2020 |
| EP | 0773614 A1 | 5/1997 |
| EP | 0887193 A1 | 12/1998 |
| EP | 0896405 A2 | 2/1999 |
| EP | 0949728 A1 | 10/1999 |
| EP | 1418631 A2 | 5/2004 |
| EP | 1533876 A2 | 5/2005 |
| JP | H09223848 A | 8/1997 |
| JP | H11168263 A | 6/1999 |
| JP | 2001068795 A | 3/2001 |
| JP | 3236774 B2 | 12/2001 |
| JP | 2003121611 A | 4/2003 |
| JP | 2005159071 A | 6/2005 |
| JP | 2006302981 A | 11/2006 |
| JP | 2009094308 A | 4/2009 |
| KR | 20140061117 A | 5/2014 |
| WO | 0245223 A1 | 6/2002 |
| WO | 2006003011 A1 | 1/2006 |
| WO | 2007027196 A2 | 3/2007 |
| WO | 2016122927 A1 | 8/2016 |
| WO | 2019036383 A1 | 2/2019 |

OTHER PUBLICATIONS

U.S. Appl. No. 16/331,991 Office Action dated Nov. 29, 2021.
U.S. Appl. No. 16/792,317 Office Action dated Dec. 7, 2021.
U.S. Appl. No. 16/812,411 Office Action dated Jan. 19, 2022.
Ohiso et al., "Buried-heterostructure long-wavelength vertical-cavity surface-emitting lasers with InGaAsP/InP-GaAs/AlAs DBRs," Electronics Letters, IEE 2000, vol. 36, No. 1, pp. 39-40, Jan. 6, 2000.
International Application # PCT/US2021/026939 Search Report dated Aug. 17, 2021.
U.S. Appl. No. 17/031,955 Office Action dated Sep. 14, 2021.
AU Application # 2021103713 Office Action dated Sep. 20, 2021.
Yeh et al., "Integration of GaAs vertical-cavity surface-emitting laser on Si by substrate removal," Applied Physics Letters, vol. 64, No. 12, pp. 1466-1467, Mar. 21, 1994.
U.S. Appl. No. 16/331,991 Office Action dated Oct. 7, 2021.
CN Application #2017800574347 Office Action dated Oct. 19, 2021.
Choquette et al., "Advances in Selective Wet Oxidation of AlGaAs Alloys", IEEE Journal of Selected Topics in Quantum Electronics, vol. 3, issue 3, pp. 916-926, Jun. 1997.
Kumar et al., "Sacrificial etching of AlxGa1-xAs for III-V MEMS surface micromachining", Applied Physics A: Materials Science & Processing, vol. 88, Issue 4, pp. 711-714, Sep. 2007.
Kim et al., "Lateral wet oxidation of AlxGa1-xAs-GaAs depending on its structure", Applied Physics Letters 69, pp. 3357-3359, year 1996.
Pu et al.: "Hybrid Integration of VCSEL's to CMOS Integrated Circuits", IEEE Journal of Selected Topics in Quantum Electronics, vol. 5, No. 2, pp. 201-208, Mar./Apr. 1999.
Neff et al., "VCSEL/CMOS smart pixel arrays for free-space optical interconnects", Proceedings of the Third International Conference on Massively Parallel Processing Using Optical Interconnections, pp. 282-289, Oct. 27-29, 1996.
Matsuo et al., "Novel technology for hybrid integration of photonic and electronic circuits", IEEE Photonics Technology Letters, vol. 8, issue 11, pp. 1507-1509, Nov. 1996.
Liu, Y., "Heterogeneous Integration of OE Arrays With Si Electronics and Micro-optics", IEEE Transactions of Advanced Packaging, vol. 25, No. 1, pp. 43-49, Feb. 2002.
Talghader., "Integration of LEDs and VCSELs using fluidic self-assembly", SPIE Proceedings, vol. 3286, pp. 86-95, Jan. 28, 1998.

(56) References Cited

OTHER PUBLICATIONS

Lin et al., "Ultra-compact, high-yield intra-cavity contacts for GaAs/AlGaAs-based vertical-cavity surface-emitting lasers", Journal of Vacuum Science & Technology B, Nanotechnology and Microelectronics: Materials Processing, Measurement, and Phenomena, vol. 31, Section 1, pp. 011205-1-011205-6, Jan./Feb. 2013.
Sanchez et al., "Single-Mode Monolithic GaSB Vertical Cavity Surface-Emitting Laser", Optics Express, vol. 20, Issue 14, pp. 15540-15546, year 2012.
EP Application # 17772843.3 office action dated Mar. 31, 2020.
KR Application # 10-2019-7007363 office action dated Mar. 18, 2020.
JP Application # 2019-515351 office action dated Feb. 10, 2020.
CN Application # 201780057434.7 Office Action dated Dec. 11, 2020.
NSM Archive, "Aluminium Gallium Arsenide—Optical Properties", pp. 1-2, Aug. 12, 2016.
NSM Archive, "Physical Properties of Semiconductors", p. 1, Aug. 23, 2016.
CN Application # 201880007030.1 office action dated Jun. 3, 2020.
International Application # PCT/US2020/21631 search report dated Jun. 16, 2020.
U.S. Appl. No. 16/477,205 office action dated Jun. 25, 2020.
Park et al., U.S. Appl. No. 16/792,317, filed Feb. 17, 2020.
Li et al., U.S. Appl. No. 16/812,411, filed Mar. 9, 2020.
EP Application # 17772843.3 Office Action dated Nov. 4, 2020.
International Application # PCT/US2020/18475 search report dated Apr. 17, 2020.
Lamy et al., "Design of an InGaAs/InP 1.55 μm electrically pumped VCSEL", Optical and Quantum Electronics, vol. 40, No. 14-15, pp. 1193-1198, Jun. 3, 2009.
EP Application # 17772843.3 Office Action dated Apr. 7, 2022.
U.S. Appl. No. 16/812,411 Office Action dated Apr. 12, 2022.
U.S. Appl. No. 16/331,991 Office Action dated Apr. 15, 2022.
JP Application # 2020159986 Office Action dated May 16, 2022.

\* cited by examiner

INTEGRATED LASER MODULE

CROSS-REFERENCE TO RELATED APPLICATION

This application claims the benefit of U.S. Provisional Patent Application 62/859,212, filed Jun. 10, 2019, which is incorporated herein by reference.

FIELD OF THE INVENTION

The present invention relates generally to semiconductor devices, and particularly to optoelectronic devices and methods for their manufacture.

BACKGROUND

In conventional, top-emitting optoelectronic devices, such as vertical-cavity surface-emitting lasers (VCSELs), the semiconductor substrate serves not only as the base for fabrication of the emitters, but also as the mechanical supporting carrier of the emitter devices after fabrication. Existing processes for bonding the emitters to heat sinks and control circuits, however, are complex and costly.

New processes have been proposed for integrating emitters with control circuits in a single chip, which is formed by bonding together a III-V semiconductor substrate on which the emitters are fabricated with a silicon substrate on which control circuits for the emitters are fabricated. For example, an array of vertical emitters can be fabricated by deposition of multiple epitaxial layers on a III-V semiconductor substrate, while control circuits for the vertical emitters are fabricated on a silicon substrate. Respective front sides of the vertical emitters are bonded to the silicon substrate in alignment with the control circuits. After bonding the respective front sides, the III-V semiconductor substrate is thinned away from respective back sides of the vertical emitters. After thinning the III-V semiconductor substrate, metal traces are deposited over the vertical emitters to connect the vertical emitters to the control circuits.

SUMMARY

Embodiments of the present invention that are described hereinbelow provide improved optoelectronic devices and methods for their fabrication.

There is therefore provided, in accordance with an embodiment of the invention, an optoelectronic device, including a driver die, which includes drive circuits and first bond pads on a front surface of the driver die connected to the drive circuits. An emitter die is mounted on the front surface of the driver die and includes one or more vertical emitters fabricated thereon and second bond pads connected to the vertical emitters. An encapsulation layer contains the emitter die and has an inner surface adjacent to the front surface of the driver die and an outer surface opposite the inner surface. Conductive vias extending through the encapsulation layer have inner ends connected to the first bond pads and outer ends at the outer surface of the encapsulation layer. A redistribution layer is disposed over the outer surface of the encapsulation layer and includes conductive traces, each of which is connected to at least one terminal selected from a group of terminals consisting of the second bond pads and the outer ends of the conductive vias.

In some embodiments, the vertical emitters include multiple vertical-cavity surface-emitting lasers (VCSELs) arranged in one or more banks.

In a disclosed embodiment, the driver die includes a cathode pad on the front surface, and the emitter die includes, on a first side of the emitter die, a cathode contact, which is bonded to the cathode pad, and the one or more vertical emitters are configured to emit radiation through a second side of the emitter die, opposite the first side.

In some embodiments, the device includes one or more surface-mounted electronic components, which are connected between the first and second bond pads by the conductive traces. Additionally or alternatively, the device includes a circuit substrate on which the driver die is mounted, wherein the redistribution layer includes external bond pads, which are connected by the conductive traces to respective ones of the first bond pads, and wherein the external bond pads are connected to circuit contacts on the circuit substrate.

In a disclosed embodiment, the conductive vias include a metal, and the encapsulation layer includes a polymer.

In one embodiment, the inner ends of the conductive vias are integrally bonded with the first bond pads in a continuous metal structure extending from the front surface of the driver die to the outer surface of the encapsulation layer. Alternatively, the inner ends of the conductive vias are fastened by an intermediate layer to the first bond pads.

In some embodiments, the encapsulation layer is molded over the front surface of the driver die around the emitter die and the conductive vias. Alternatively or additionally, the encapsulation layer containing the emitter die and the conductive vias is formed as an integral unit, which is then attached to the driver die.

There is also provided, in accordance with an embodiment of the invention, an optoelectronic device, which includes a driver die including drive circuits and first bond pads on a front surface of the driver die connected to the drive circuits. A redistribution layer is disposed over the front surface of the driver die and includes conductive traces. An emitter die, which has first and second sides, is disposed over the redistribution layer with the first side adjacent to the redistribution layer. The emitter die includes one or more vertical emitters fabricated on the emitter die and configured to emit radiation through the second side of the emitter die, and through-substrate vias (TSVs), which extend through the emitter die and have inner ends terminating at second bond pads at the first side of the emitter die and outer ends connecting to electrodes of the vertical emitters at the second side of the emitter die. Each of the conductive traces in the redistribution layer is connected to at least one bond pad, selected from among the first and second bond pads.

There is additionally provided, in accordance with an embodiment of the invention, a method for fabricating an optoelectronic device, which includes providing a driver die including drive circuits and first bond pads on a front surface of the driver die connected to the drive circuits. On the front surface of the driver die an emitter die is mounted including one or more vertical emitters fabricated thereon and second bond pads connected to the vertical emitters. Inner ends of conductive vias are bonded to the first bond pads. An encapsulation layer is formed so as to contain the emitter die and the conductive vias, such that an inner surface of the encapsulation layer is adjacent to the front surface of the driver die, and the conductive vias extend through the encapsulation layer to outer ends at an outer surface of the encapsulation layer. Over the outer surface of the encapsulation layer, a redistribution layer is formed including conductive traces, each of which is connected to at least one terminal selected from a group of terminals consisting of the second bond pads and the outer ends of the conductive vias.

The present invention will be more fully understood from the following detailed description of the embodiments thereof, taken together with the drawings in which:

BRIEF DESCRIPTION OF THE DRAWINGS

FIG. 10 is a schematic frontal view of a stacked die, in which the VCSEL die of FIG. 1A is mounted on the driver die of FIG. 1B, with the addition of a redistribution layer, in accordance with an embodiment of the invention;

DETAILED DESCRIPTION OF EMBODIMENTS

Overview

Figure 1A:
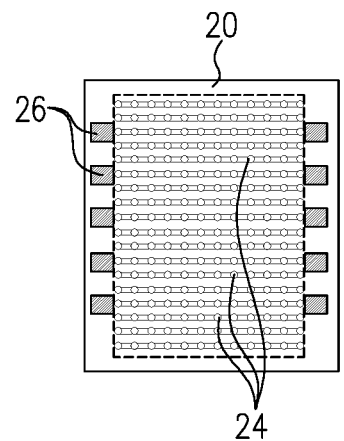
FIG. 1A is a schematic frontal view of a VCSEL die, in accordance with an embodiment of the invention.

The embodiments of the present invention that are described hereinbelow provide improved methods for large-scale production of emitters and emitter arrays, as well as optoelectronic devices produced by such methods. The emitters are integrated with control circuits in a single chip, which is formed by mounting an emitter die, on which vertical emitters are fabricated, directly onto a driver die, on which drive circuits for the emitters are fabricated.

In the embodiments that are described hereinbelow, for the sake of concreteness and clarity, the emitter die is assumed to be made from a III-V semiconductor substrate, such as a GaAs wafer, and the vertical emitters are assumed to be VCSELs, comprising multiple epitaxial layers deposited on the GaAs substrate. It is also assumed that the driver die is made from a silicon wafer, and the drive circuits are fabricated using a CMOS process, as is known in the art. The principles of the present invention may alternatively be applied, however, in producing other types of vertical emitters, for example light-emitting diodes, and/or using other sorts of substrates, such as other types and combinations of III-V wafers, as well as other circuit fabrication processes, as will be apparent to those skilled in the art after reading the present description. All such alternative embodiments are considered to be within the scope of the present invention.

In some applications of such devices, the VCSELs are required to emit short pulses, for example pulses of 1 ns duration or less, at high frequencies, typically in the multi-megahertz range. This mode of operation requires high-frequency drive signals with precisely-controlled pulse shape and timing. To satisfy this requirement, the signal lines to the emitter die from the driver die, where the signals are generated, should be short, with low impedance.

Embodiments of the present invention that are described herein address these constraints by means of an additional redistribution layer, which comprises conductive traces connected to the bond pads on the driver die and on the emitter die. These traces fan in or fan out from the locations of the bond pads on the dies in order to make short, well-controlled connections, with low impedance, between the driver and emitter dies. The redistribution layer can also be designed to accommodate surface-mounted passive components, such as coupling capacitors, and external bond pads for connection of the driver die to a circuit substrate on which the device is mounted.

The use of this sort of redistribution layer is also advantageous in that it can adapt easily to different placements of the bond pads on the emitter and driver dies, and thus permits the emitter and driver dies to be designed and optimized separately. The emitter die may comprise multiple emitters or multiple banks of emitters, and the drive circuits can be designed and connected to actuate the emitters individually, or by bank, or all together. Different types of emitter dies may be integrated on the same driver chip, and vice versa, simply by making the necessary changes in the traces of the redistribution layer.

Device Design and Fabrication

Figure 1B:
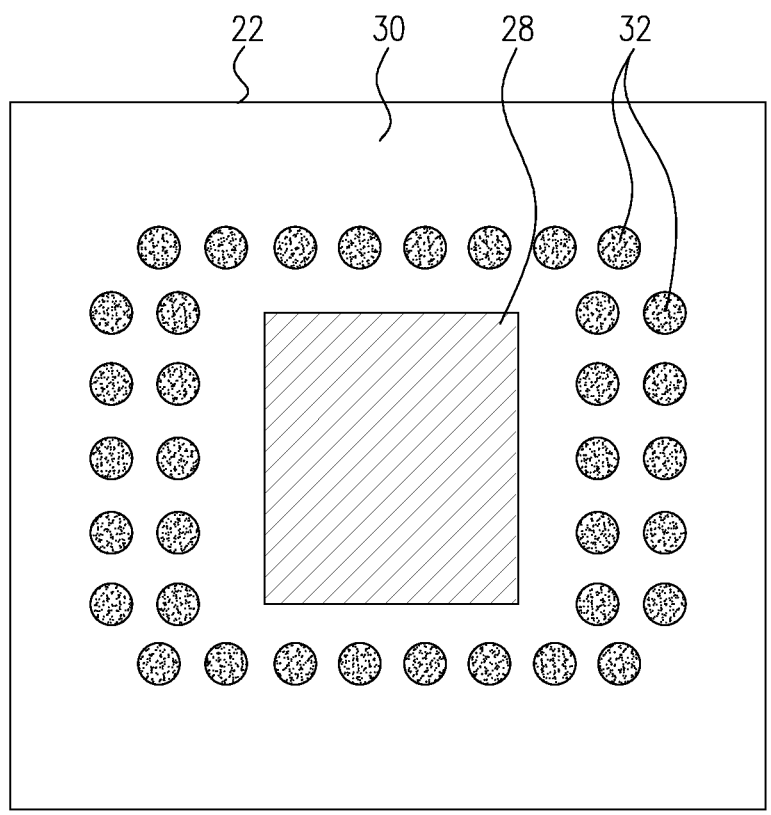
FIG. 1B is a schematic frontal view of a driver die, in accordance with an embodiment of the invention.

Reference is now made to FIGS. 1A-1D, which schematically illustrate the components of an optoelectronic device 42 and their mode of assembly, in accordance with an embodiment of the invention. FIG. 1A is a schematic frontal view of a VCSEL die 20, while FIG. 1B is a schematic frontal view of a driver die 22, before assembly of the VCSEL die thereon. Dies 20 and 22 are fabricated on GaAs and silicon wafers, respectively, by methods that are known in the art. After fabrication, the GaAs wafer is diced to produce multiple dies 20, which are then mounted on respective dies 22 within the silicon wafer. Dicing of the silicon wafer typically takes place only after assembly of dies 20 and the other device components on dies 22, so that the process steps can all be carried out at wafer scale.

VCSEL die 20 comprises an array of VCSELs 24, which may be arranged in multiple banks. The VCSELs emit radiation in the forward direction, out of the side of die 20 that is shown in FIG. 1A. Die 20 typically comprises a common cathode contact (not shown in this figure) on the reverse side of the die, which is shared among the VCSELs. Bond pads 26 are connected to conductors (not shown) on die 20 that connect to the anodes of the VCSELs in the various banks.

Driver die 22 comprises a cathode pad 28 on the front surface of the die, to which the cathode contact on VCSEL die 20 can be bonded. Drive circuits 30 (not shown explicitly) are fabricated on driver die 22 and connect to conductive vias 32 extending outward from bond pads on the front surface of the die.

Figure 1C:
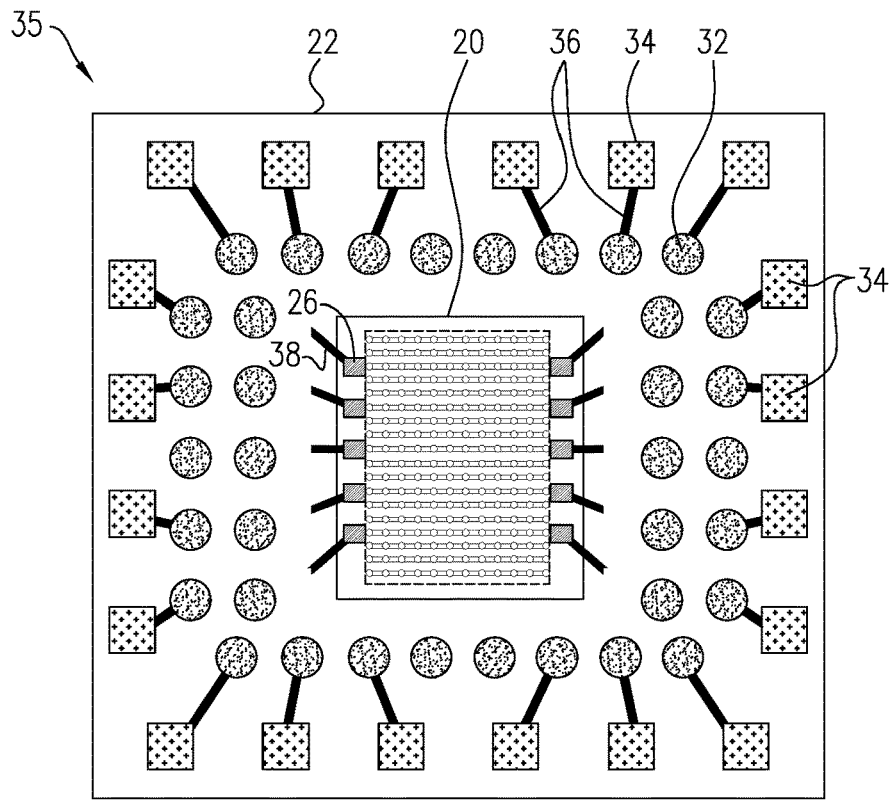
FIG. 1D is a schematic frontal view of an optoelectronic device including the stacked die of FIG. 10, with the addition of surface mounted devices, in accordance with an embodiment of the invention.
Figure 1D:
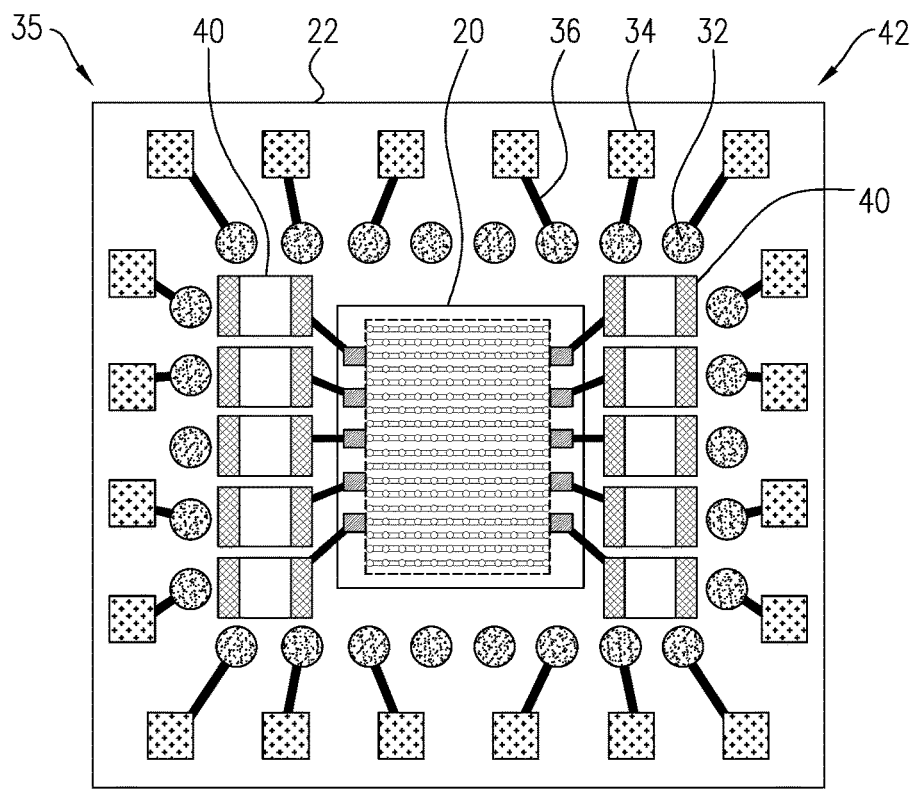

In the view shown in FIG. 1C, VCSEL die 20 has been mounted on ("stacked") and bonded to cathode pad 28 on driver die 22. A redistribution layer (RDL) 35 has been formed over the area of driver die 22, using processes described with reference to the figures that follow. RDL 35 comprises external bond pads 34, which are connected by fan-in traces 36 to bond pads on driver die 22 through vias 32. Other fan-in traces 38 in RDL 35 connect to bond pads 26 on VCSEL die 20. Thus, bond pads 26 and the outer ends of vias 32 serve as terminals for the traces in RDL 35, each of which is connected to at least one of these terminals. Traces 38 interconnect bond pads 26 with corresponding bond pads on driver die 22 through vias 32, either directly (not shown in this figure) or through in-line surface-mounted components 40, as shown in FIG. 1D. Traces 38 are laid out so that the surface-mounted components can be placed on the outer surface of RDL 35 and connected directly between vias 32 and traces 38.

FIGS. 2A-2F are schematic sectional views showing successive stages in production of device 42, in accordance with an embodiment of the invention. Although these and subsequent figures show, for the sake of simplicity, a single driver die 22 as a separate entity, the processes illustrated in the figures are typically carried out at wafer scale, i.e., over an array of multiple driver dies on a silicon wafer.

Figure 2A:
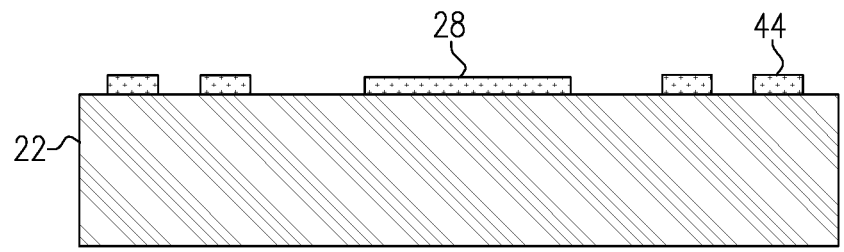
FIGS. 2A, 2B, 2C, 2D, 2E and 2F are schematic sectional views showing successive stages in production of the device of FIG. 1D, in accordance with an embodiment of the invention.
Figure 2B:
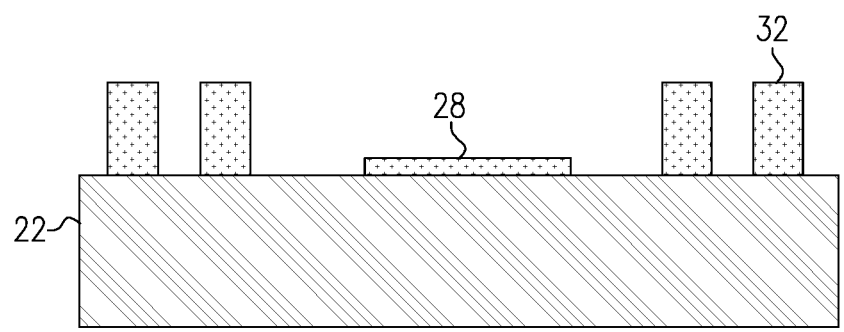

FIG. 2A shows driver die 22 at the beginning of the process, with cathode pad 28 and bond pads 44 on the front surface of the driver die. In FIG. 2B, vias 32 are integrally bonded with bond pads 44 in a continuous metal structure. For this purpose, for example, a photoresist mask may be deposited over the front surface of driver die 22, and then exposed with a suitable photolithographic pattern and developed to open through-holes over the locations of bond pads 44. The through-holes are filled with a suitable metal, for example copper, and the remaining photoresist is then removed, leaving vias 32 protruding vertically upward from die 22.

Figure 2C:
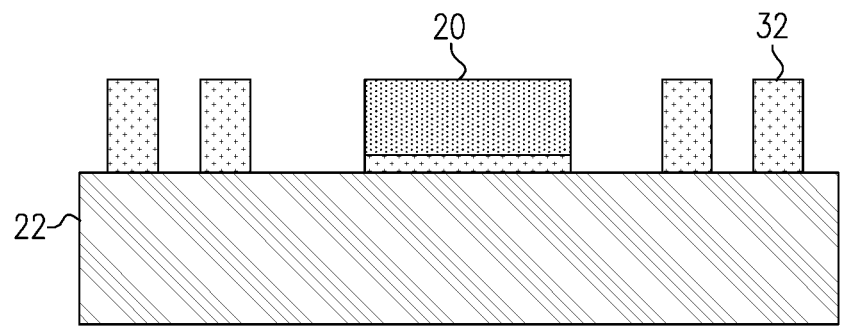

The thickness of the photoresist is chosen so that the heights of vias 32 match the thickness of VCSEL die 20, which is then attached to cathode pad 28 as shown in FIG. 2C. (Alternatively, the thickness of the photoresist may be such that the heights of the vias are initially greater than the thickness of the VCSEL die, and the vias may then be ground down or otherwise reduced to the appropriate height.) The cathode contact of the VCSEL die may be mechanically and electrically attached to the cathode pad using any suitable means that are known in the art, such as conductive epoxy, soldering, or metal-to-metal bonding. Typically, both VCSEL die 20 and driver die 22 are tested before attaching the VCSEL die to the driver die, to ensure that only known-good dies are used.

Figure 2D:
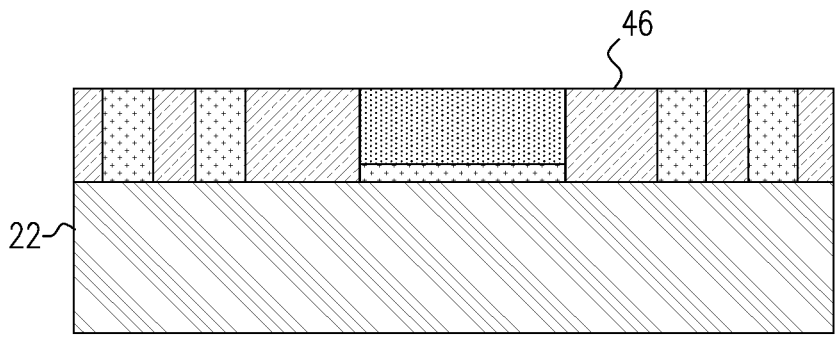

An encapsulation layer 46 is molded over the front surface of driver die 22, around VCSEL die 20 and vias 32, as shown in FIG. 2D. Encapsulation layer 46 contains VCSEL die 20 and vias 32, while leaving the upper surfaces of the VCSEL die and vias exposed. The encapsulation layer may conveniently comprise a polymer, such as a suitable epoxy, which coats and passivates the encapsulated structures.

Figure 2E:
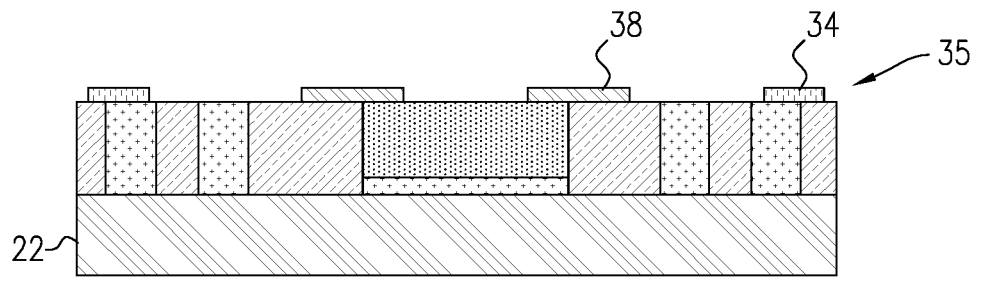

In this embodiment, RDL 35 is formed over encapsulation layer 46, as shown in FIG. 2E. Traces 36 (not shown in this figure) and traces 38 in RDL 35, as well as external bond pads 34, are formed on the upper surface of the encapsulation layer by photolithographic processes that are known in the art, with connections as required to bond pads 26 and to the upper surfaces of vias 32. At this stage, it may also be desirable to thin the back side of driver die 22, as shown in the figure.

Figure 2F:
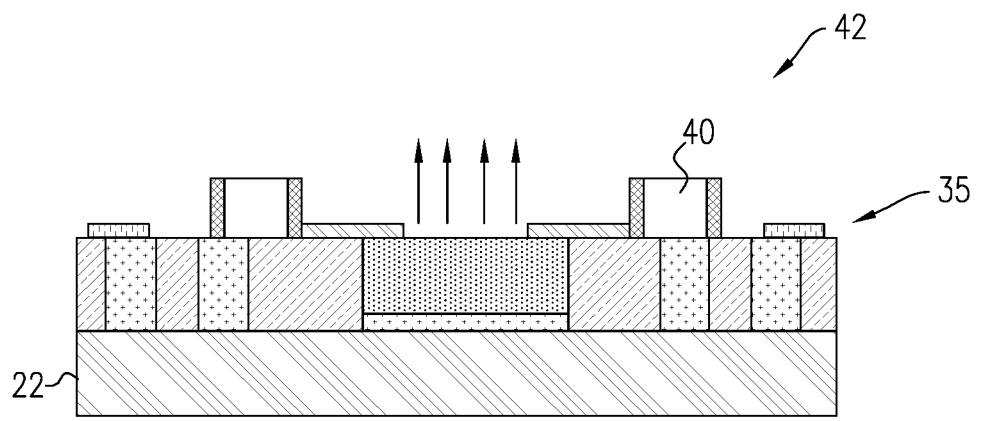

To complete the fabrication of device 42, surface-mounted components 40 are mounted on and connected to traces 38 in RDL 35, as shown in FIG. 2F. In response to drive signals from driver die 22, the VCSELs on die 20 will then emit radiation through the upper side of the die 20, away from driver die 22. At this point the silicon wafer containing die 22 can be diced to singulate device 42.

FIGS. 3A-3G are schematic sectional views showing successive stages in production of a device 50 including VCSEL die 20 and driver die 22, in accordance with another embodiment of the invention. This embodiment uses a temporary carrier 52 to form an encapsulation layer 56 as an integral unit, which is then attached to driver die 22. In this case, the inner ends of conductive vias 32 are fastened to bond pads 34 by an intermediate layer 58, such as a solder or conductive adhesive. In other respects, however, the resulting device 50 is similar in structure and function to device 42, as described above.

Figure 3A:
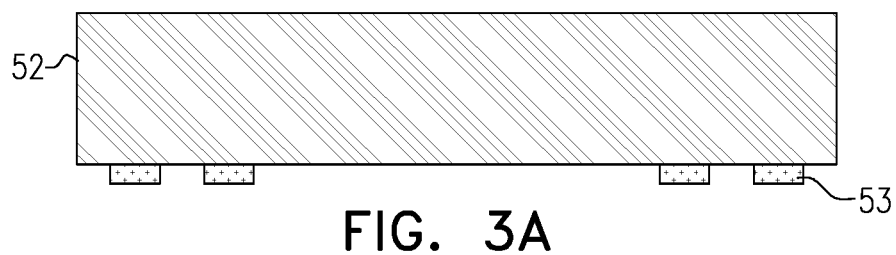
FIGS. 3A, 3B, 3C, 3D, 3E, 3F and 3G are schematic sectional views showing successive stages in production of a device including a VCSEL die and driver die, in accordance with another embodiment of the invention.
Figure 3B:
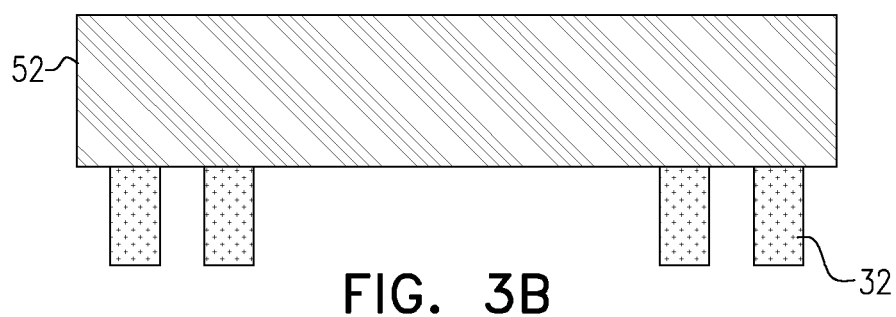
Figure 3C:
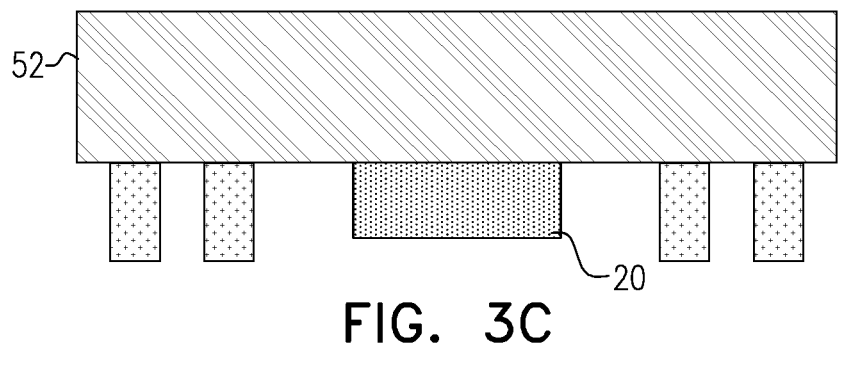
Figure 3D:
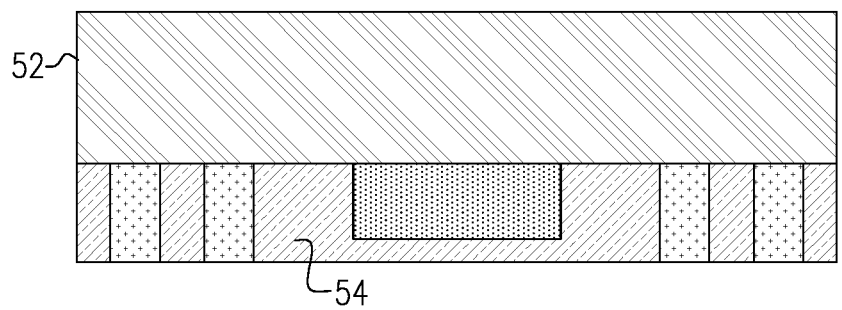

Temporary carrier 52 comprises a suitable substrate, such as a silicon wafer, on which metal seed pads 53 are deposited, as shown in FIG. 3A. Vias 32 are then formed on seed pads 53 as shown in FIG. 3B, using a process similar to that described above with reference to FIGS. 2B and 2C. VCSEL die 20 is temporarily bonded to carrier 52, as shown in FIG. 3C, with the emitting surface of the VCSELs facing toward carrier 52. An encapsulant 54 is then molded over the surface of carrier 52, so that VCSEL die 20 and vias 32 are contained in the encapsulant, as shown in FIG. 3D. Encapsulant 54 may comprise a suitable polymer, such as an epoxy, as in the preceding embodiment.

Figure 3E:
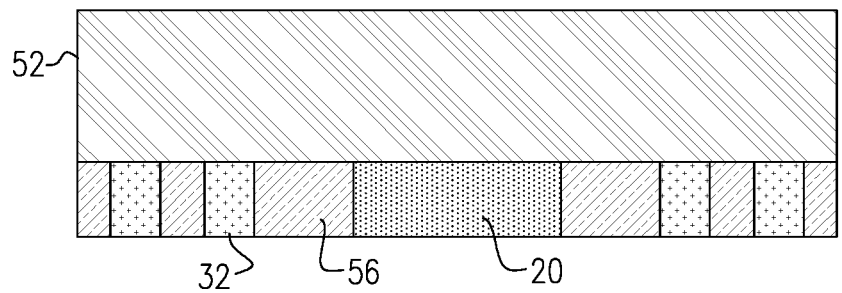
Figure 3F:
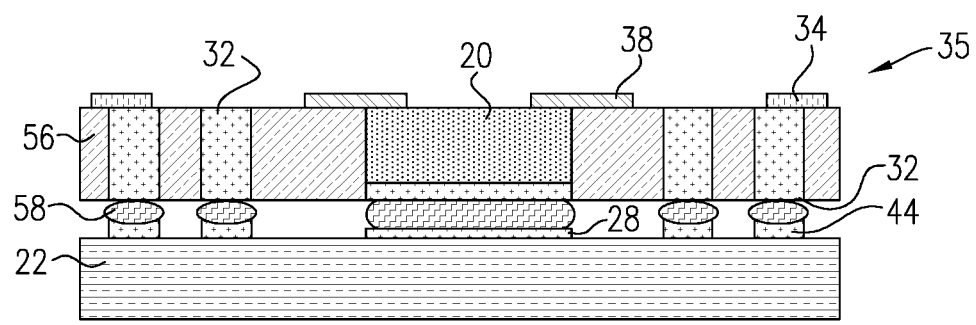

In preparation for connection to driver die 22, the outer surface of the encapsulant is polished, to bring encapsulation layer 56 into its final shape and expose the lower surfaces of VCSEL die 20 and vias 32, as shown in FIG. 3E. The cathode contact of VCSEL die 20 is then attached to cathode pad 28 on driver die 22, and vias 32 are connected to bond pads 44 on the driver die, by means of intermediate layer 58, as shown in FIG. 3F. As noted earlier, intermediate layer 58 may comprise a solder or conductive adhesive, for example. Alternatively, the connections of the conductive contacts, pads and vias may be made by any other suitable progress, such as ultrasonic metal-to-metal bonding.

Figure 3G:
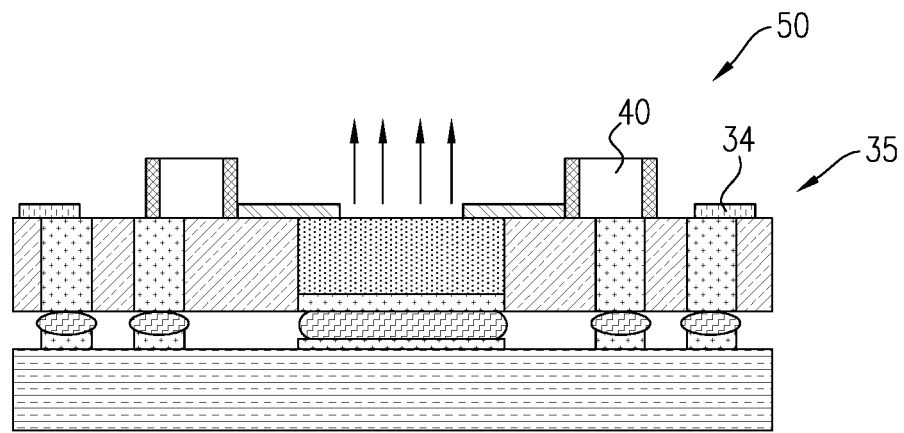

At this point, temporary carrier 52 is removed, for example by etching or polishing. Redistribution layer (RDL) 35 is then formed over the outer surface of encapsulation layer 56. The redistribution layer is similar in structure and functionality to that shown in FIG. 2E. To complete the fabrication of device 50, surface-mounted components 40 are mounted on and connected to traces 38 in RDL 35, as shown in FIG. 3G.

Figure 4A:
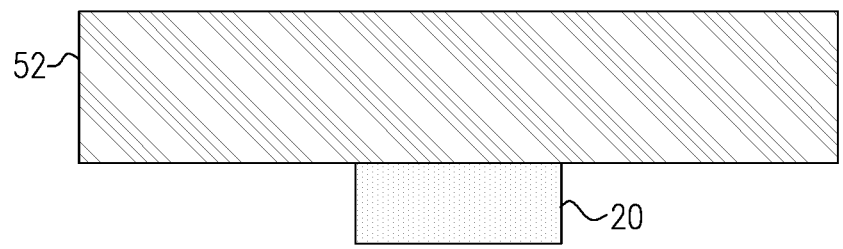
FIGS. 4A, 4B, 4C, 4D, 4E and 4F are schematic sectional views showing successive stages in production of a device including a VCSEL die and driver die, in accordance with yet another embodiment of the invention.
Figure 4B:
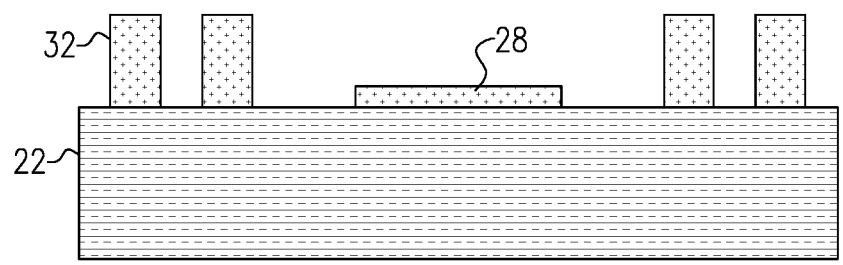
Figure 4C:
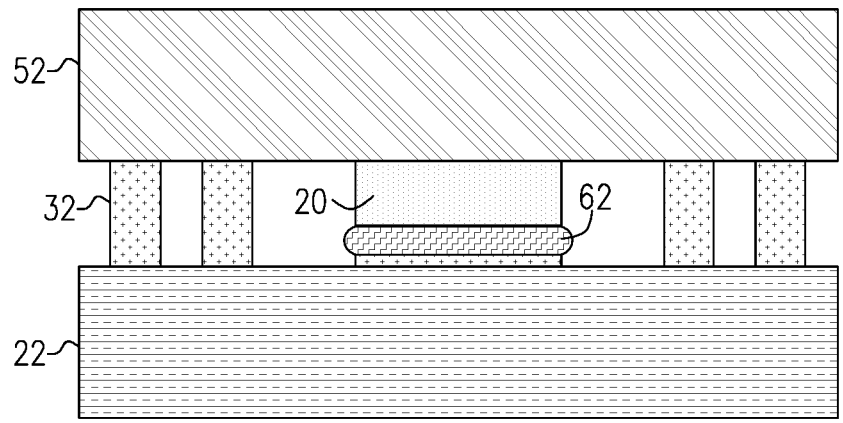
Figure 4D:
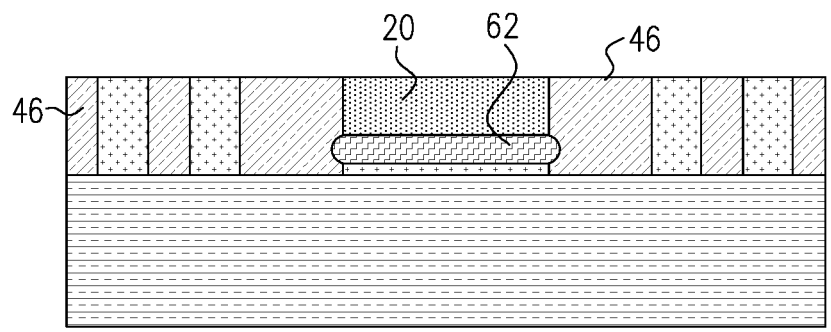
Figure 4E:
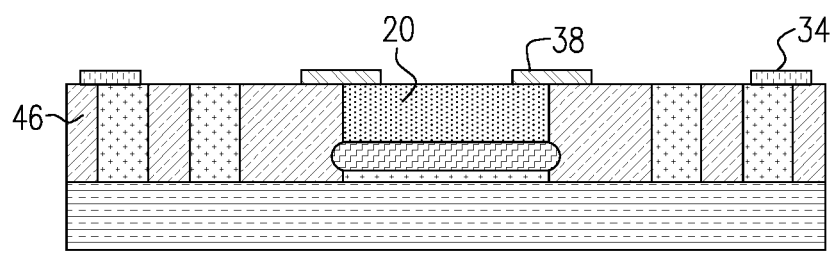

FIGS. 4A-4F are schematic sectional views showing successive stages in production of a device 60 including VCSEL die 20 and driver die 22, in accordance with yet another embodiment of the invention. This embodiment combines features of the two preceding embodiments: VCSEL die 20 is fastened to temporary carrier 52, as shown in FIG. 4A, but vias 32 are grown on driver die 22, as shown in FIG. 4B. The cathode contact of VCSEL die 20 is then attached to cathode pad 28 on driver die 22 by an intermediate layer 62, as shown in FIG. 4C. Vias 32 may serve as a mechanical stop in the attachment process, while intermediate layer 62 comprises a conductive material that is sufficiently malleable to take up any remaining difference in height. For example, intermediate layer 62 may comprise a conductive epoxy or sinter paste.

Figure 4F:
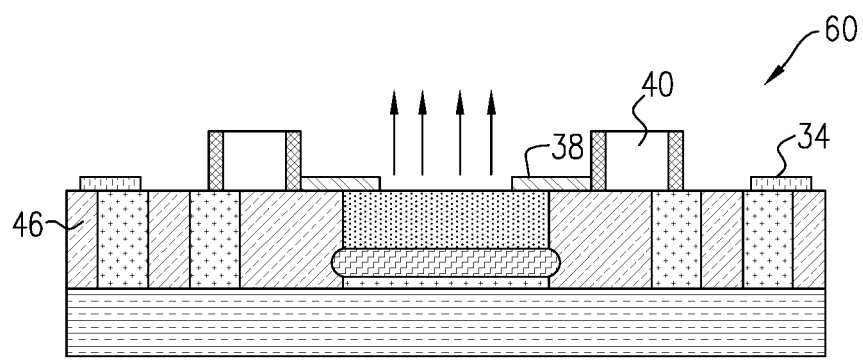

Carrier 52 is now removed, exposing the outer surfaces of VCSEL die 20 and vias 32. Encapsulation layer 46 is molded over the front surface of driver die 22 (FIG. 4D), followed by deposition of redistribution layer 35 (FIG. 4E), and assembly of surface-mounted components 40 (FIG. 4F). These steps proceed in substantially the same manner as was described above with reference to FIGS. 2D, 2E and 2F.

Circuit Assemblies

Figure 5A:
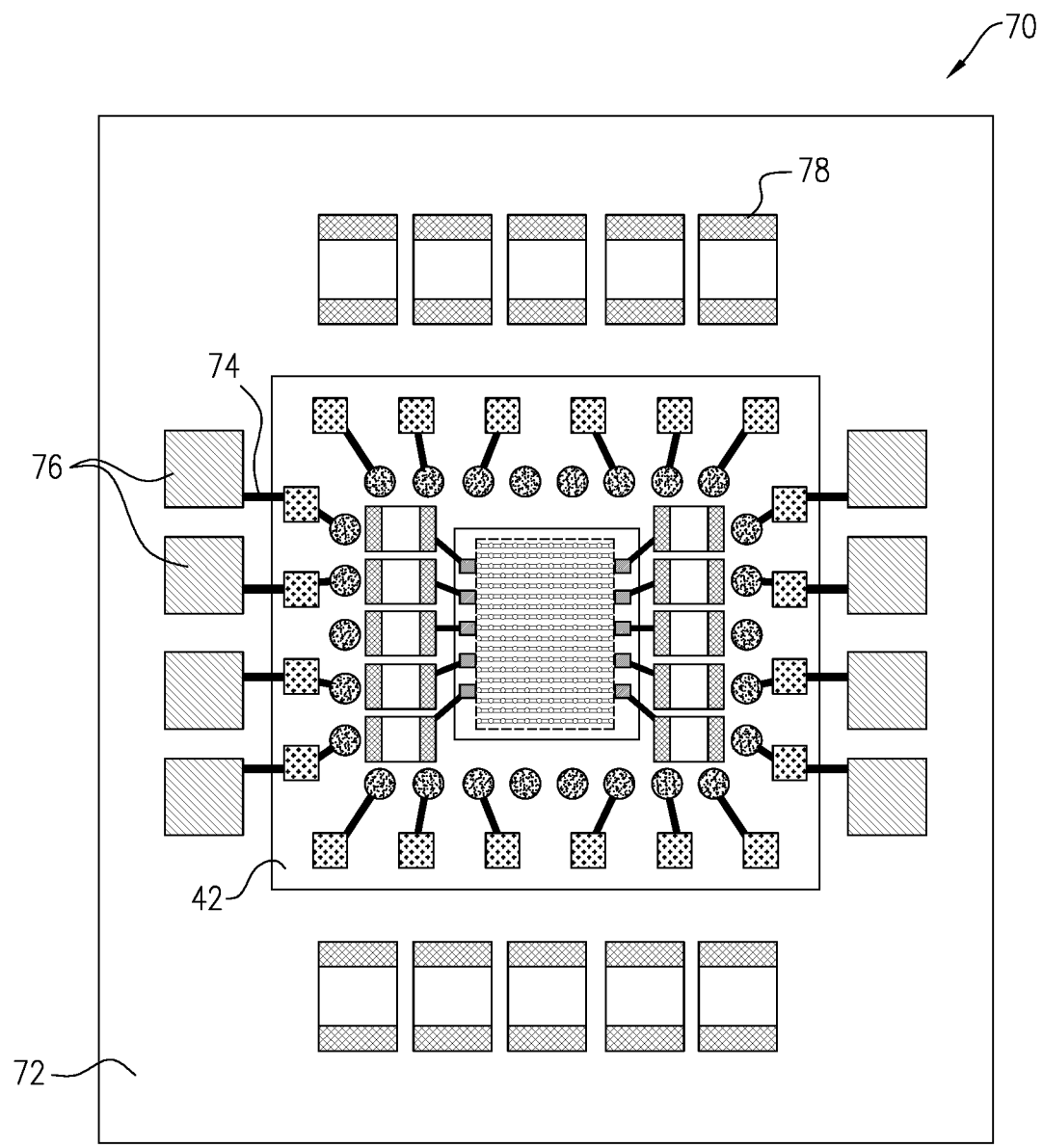
FIGS. 5A and 5B are schematic frontal and sectional views, respectively, of an assembly comprising a circuit substrate on which the device of FIG. 1D is mounted, in accordance with an embodiment of the invention.
Figure 5B:
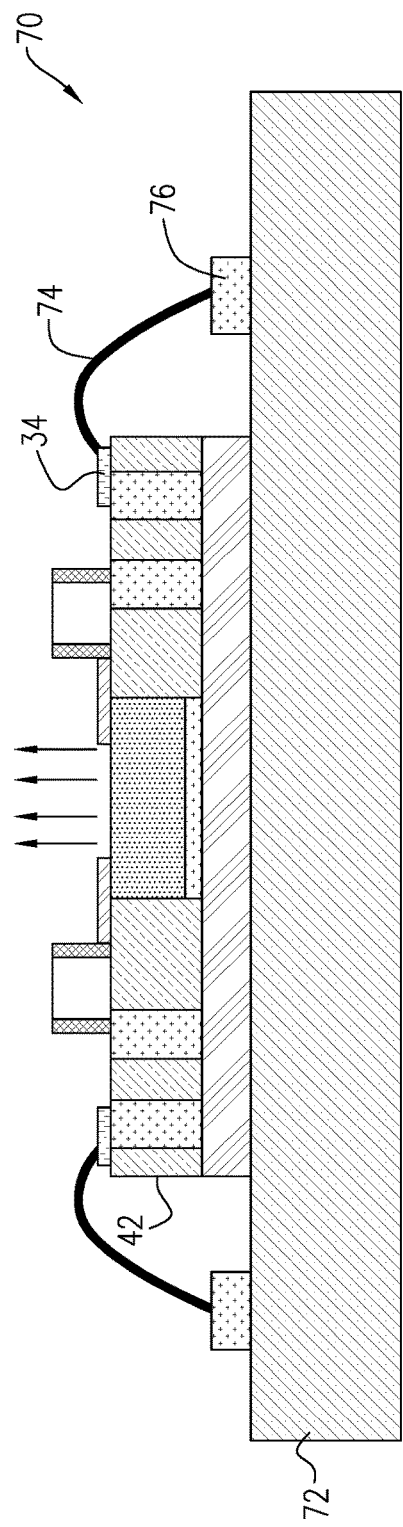

FIGS. 5A and 5B are schematic frontal and sectional views, respectively, of an assembly 70 comprising a circuit substrate 72 on which device 42 (FIG. 1D) is mounted, in accordance with an embodiment of the invention. Circuit substrate 72 may comprise, for example, a larger semiconductor chip or a printed circuit board. To connect device 42 to other support and control circuits (not shown in the figures) on substrate 72, external bond pads 34 of device 42 are connected to circuit contacts 76 on substrate 72, for example by wire bonds 74. Ancillary components 78, including both passive and active devices, may likewise be mounted on substrate 72 and connected to contacts 76 by suitable conductive traces (not shown).

Figure 6:
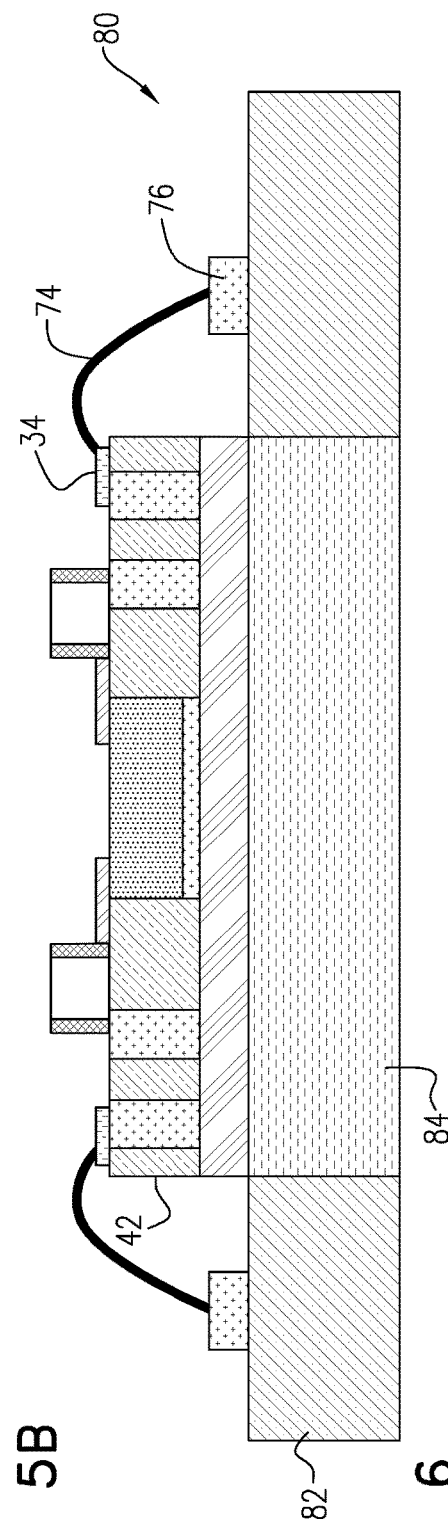
FIG. 6 is a schematic sectional view of an assembly comprising a circuit substrate with an integrated heat sink on which the device of FIG. 1D is mounted, in accordance with another embodiment of the invention.

FIG. 6 is a schematic sectional view of an assembly 80 comprising a circuit substrate 82 on which device 42 is mounted, in accordance with another embodiment of the invention. This embodiment is similar to the embodiment of FIGS. 5A/B, except that substrate 82 in this case comprises an integrated heat sink 84 below device 42. This design is useful in dissipating the substantial amount of heat generated by VCSEL die 20.

Figure 7:
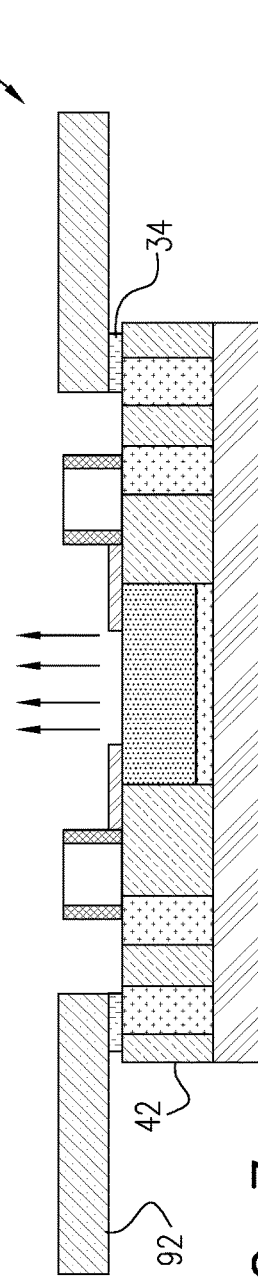
FIG. 7 is a schematic sectional view of an assembly comprising a circuit substrate on which the device of FIG. 1D is mounted, in accordance with yet another embodiment of the invention.

FIG. 7 is a schematic sectional view of an assembly 90 comprising a circuit substrate 92 on which device 42 is mounted, in accordance with yet another embodiment of the invention. In this embodiment, device 42 is mounted in a flip-chip configuration, with external bond pads 34 contacting a suitable ball grid (not shown), for example, on substrate 92. The VCSELs on die 20 emit their radiation through an opening in substrate 92.

Alternative Embodiment

Figure 8A:
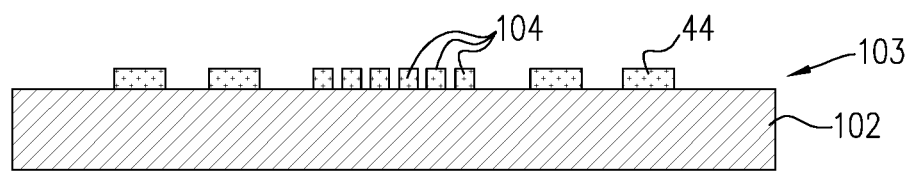
FIGS. 8A, 8B, 8C, 8D and 8E are schematic sectional views showing successive stages in production of a device including a VCSEL die and driver die, in accordance with an alternative embodiment of the invention.
Figure 8B:
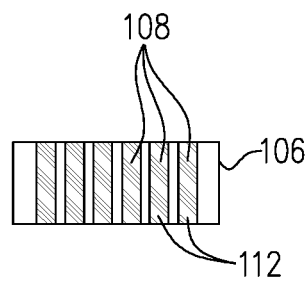
Figure 8C:
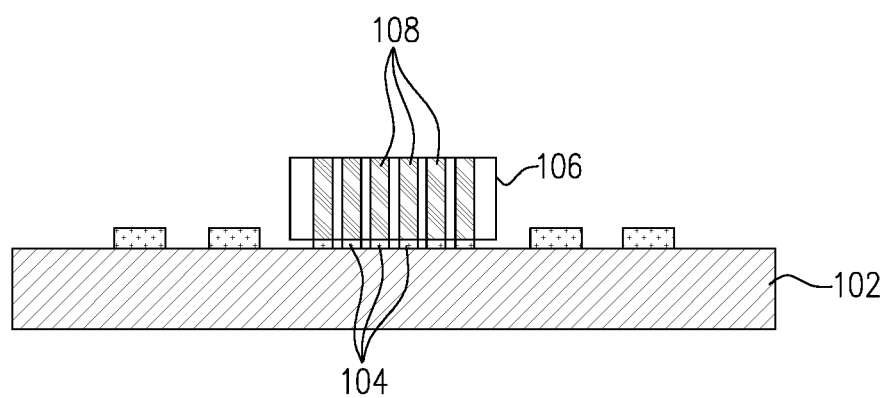

FIGS. 8A-8E are schematic sectional views showing successive stages in production of a device 100 including a VCSEL die 106 and a driver die 102, in accordance with an alternative embodiment of the invention. In this embodiment (in contrast to the preceding embodiments), a redistribution layer 103 is formed over the front surface of driver die 102, as shown in FIG. 8A. Instead of cathode pad 28, redistribution layer 103 includes multiple pads 104, which match the locations of bond pads 112 on VCSEL die 106, as shown in FIG. 8B. VCSEL die 106 comprises conductive through-substrate vias (TSVs) 108, which extend through the VCSEL die and terminate at bond pads 112, which are formed at the inner ends of TSVs 108. The outer ends of the TSVs connect to the electrodes (for example the respective anodes) of the VCSELs at the upper side of die 106.

Emitter die 106 is disposed over redistribution layer 103 on driver die 102, as shown in FIG. 3C. Bond pads 112 on the lower side of die 106, which is adjacent to redistribution layer 103, connect to the conductive traces in the redistribution layer via contact pads 104. The VCSELs in die 106 emit their radiation through the opposite (upper) side.

Figure 8D:
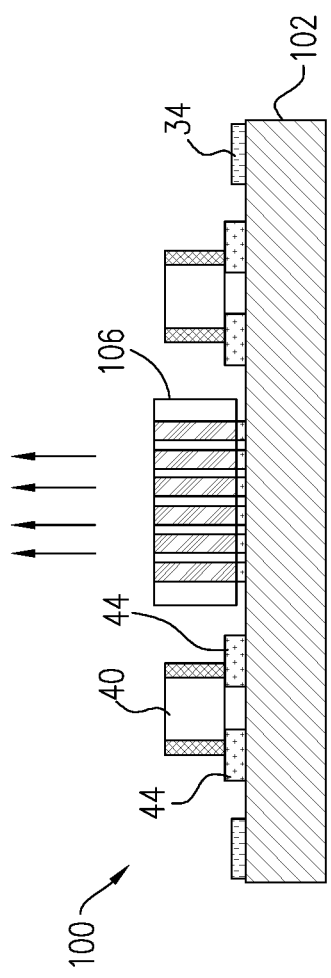
Figure 8E:
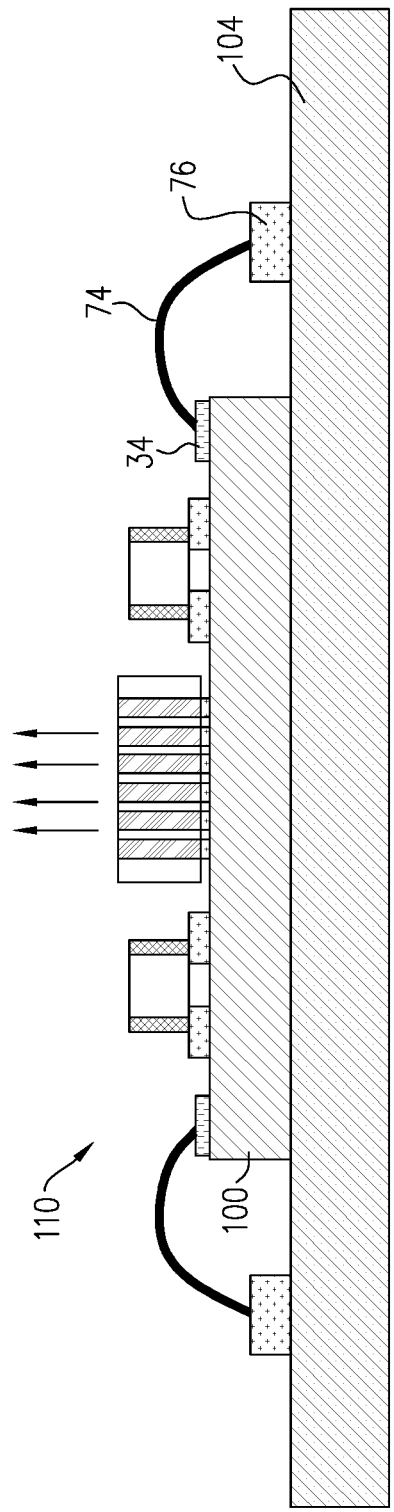

To complete the fabrication of device 100, surface-mounted components 40 may be mounted between bond pads 44 in the redistribution layer on driver die 102, as shown in FIG. 8D. In some cases, device may then be covered with an encapsulation layer (not shown). Finally, an assembly 110 is created by mounting device 100 on a suitable circuit substrate 104, as illustrated in FIG. 8E.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
   a driver die comprising drive circuits and first bond pads on a front surface of the driver die connected to the drive circuits;
   an emitter die, which is mounted on the front surface of the driver die and comprises one or more vertical emitters fabricated thereon and second bond pads connected to the vertical emitters;
   an encapsulation layer, which contains the emitter die and has an inner surface adjacent to the front surface of the driver die and an outer surface opposite the inner surface;
   conductive vias extending through the encapsulation layer and having inner ends connected to the first bond pads and outer ends at the outer surface of the encapsulation layer; and
   a redistribution layer, which is disposed over the outer surface of the encapsulation layer and comprises conductive traces, each of which is connected to at least one terminal selected from a group of terminals consisting of the second bond pads and the outer ends of the conductive vias.

2. The device according to claim 1, wherein the vertical emitters comprise multiple vertical-cavity surface-emitting lasers (VCSELs) arranged in one or more banks.

3. The device according to claim 1, wherein the driver die comprises a cathode pad on the front surface, and wherein the emitter die comprises, on a first side of the emitter die, a cathode contact, which is bonded to the cathode pad, and the one or more vertical emitters are configured to emit radiation through a second side of the emitter die, opposite the first side.

4. The device according to claim 1, and comprising one or more surface-mounted electronic components, which are connected between the first and second bond pads by the conductive traces.

5. The device according to claim 1, and comprising a circuit substrate on which the driver die is mounted, wherein the redistribution layer comprises external bond pads, which are connected by the conductive traces to respective ones of the first bond pads, and wherein the external bond pads are connected to circuit contacts on the circuit substrate.

6. The device according to claim 1, wherein the conductive vias comprise a metal, and the encapsulation layer comprises a polymer.

7. The device according to claim 1, wherein the inner ends of the conductive vias are integrally bonded with the first bond pads in a continuous metal structure extending from the front surface of the driver die to the outer surface of the encapsulation layer.

8. The device according to claim 1, wherein the inner ends of the conductive vias are fastened by an intermediate layer to the first bond pads.

9. The device according to claim 1, wherein the encapsulation layer is molded over the front surface of the driver die around the emitter die and the conductive vias.

10. The device according to claim 1, wherein the encapsulation layer containing the emitter die and the conductive vias is formed as an integral unit, which is then attached to the driver die.

11. An optoelectronic device, comprising:
a driver die comprising drive circuits and first bond pads on a front surface of the driver die connected to the drive circuits;
a redistribution layer, which is disposed over the front surface of the driver die and comprises conductive traces; and
an emitter die, which has first and second sides and is disposed over the redistribution layer with the first side adjacent to the redistribution layer, and which comprises:
one or more vertical emitters fabricated on the emitter die and configured to emit radiation through the second side of the emitter die; and
through-substrate vias (TSVs), which extend through the emitter die and have inner ends terminating at second bond pads at the first side of the emitter die and outer ends connecting to electrodes of the vertical emitters at the second side of the emitter die,
wherein each of the conductive traces in the redistribution layer is connected to at least one bond pad, selected from among the first and second bond pads.

12. The device according to claim 11, wherein the vertical emitters comprise multiple vertical-cavity surface-emitting lasers (VCSELs) arranged in one or more banks.

13. The device according to claim 11, and comprising one or more surface-mounted electronic components, which are connected between the first and second bond pads by the conductive traces.

14. The device according to claim 11, and comprising a circuit substrate on which the driver die is mounted, wherein the redistribution layer comprises external bond pads, which are connected by the conductive traces to respective ones of the first bond pads, and wherein the external bond pads are connected to circuit contacts on the circuit substrate.

15. A method for fabricating an optoelectronic device, comprising:
providing a driver die comprising drive circuits and first bond pads on a front surface of the driver die connected to the drive circuits;
mounting on the front surface of the driver die an emitter die comprising one or more vertical emitters fabricated thereon and second bond pads connected to the vertical emitters;
bonding inner ends of conductive vias to the first bond pads;
forming an encapsulation layer so as to contain the emitter die and the conductive vias, such that an inner surface of the encapsulation layer is adjacent to the front surface of the driver die, and the conductive vias extend through the encapsulation layer to outer ends at an outer surface of the encapsulation layer; and
forming over the outer surface of the encapsulation layer a redistribution layer comprising conductive traces, each of which is connected to at least one terminal selected from a group of terminals consisting of the second bond pads and the outer ends of the conductive vias.

16. The method according to claim 15, wherein the conductive vias comprise a metal, and the encapsulation layer comprises a polymer.

17. The method according to claim 15, wherein the inner ends of the conductive vias are integrally bonded with the first bond pads in a continuous metal structure extending from the front surface of the driver die to the outer surface of the encapsulation layer.

18. The method according to claim 15, wherein bonding the inner ends of the conductive vias comprises fastening the inner ends by an intermediate layer to the first bond pads.

19. The method according to claim 15, wherein forming the encapsulation layer comprises molding the encapsulation layer over the front surface of the driver die around the emitter die and the conductive vias.

20. The method according to claim 15, wherein the encapsulation layer containing the emitter die and the conductive vias is formed as an integral unit, which is then attached to the driver die.

* * * * *